US006863870B2

(12) United States Patent
Hall et al.

(10) Patent No.: US 6,863,870 B2
(45) Date of Patent: Mar. 8, 2005

(54) PLASMA ENHANCED GAS REACTOR

(75) Inventors: Stephen Ivor Hall, Oxford (GB); Robert Francis King, Abingdon (GB); Martin Harte, Faringdon (GB); John Stedman, Abingdon (GB)

(73) Assignee: Accentus PLC, Didcot (GB)

( * ) Notice: Subject to any disclaimer, the term of this patent is extended or adjusted under 35 U.S.C. 154(b) by 8 days.

(21) Appl. No.: 10/363,414

(22) PCT Filed: Aug. 22, 2001

(86) PCT No.: PCT/GB01/03767

§ 371 (c)(1),
(2), (4) Date: Mar. 4, 2003

(87) PCT Pub. No.: WO02/21567

PCT Pub. Date: Mar. 14, 2002

(65) Prior Publication Data

US 2003/0175181 A1 Sep. 18, 2003

(30) Foreign Application Priority Data

Sep. 6, 2000 (GB) .............................. 0021815

(51) Int. Cl.⁷ ............................... B01J 19/08

(52) U.S. Cl. .................................. 422/186.04; 422/186

(58) Field of Search ............................ 422/186, 186.04

(56) References Cited

U.S. PATENT DOCUMENTS 4,801,435 A    1/1989   Tylko .................... 422/186.04

FOREIGN PATENT DOCUMENTS

| EP | 0577344 | 1/1994 | ............ B01J/19/08 |
| GB | 987540 | 3/1965 | |
| GB | 2273027 | 6/1994 | ............ H05H/1/34 |
| GB | 2319941 | 6/1998 | ............ H01J/37/32 |

Primary Examiner—Steven Versteeg
(74) Attorney, Agent, or Firm—William H. Holt

(57) ABSTRACT

A reaction chamber (12, 49) is adapted to be coupled to a source of microwave radiation. A pair of opposed field enhancing electrodes (18, 21; 62, 63) concentrate microwave energy so as to form plasma in a localised region between the electrodes. Gas passages are arranged for passing a gaseous medium into and out of the chamber so that the gaseous medium passes through the said localised region of plasma. The electrodes comprise electrically conducting tubes (18, 21; 62, 63) held in electrode holders (17, 19; 53, 54) located in the chamber wall, the electrode tubes being removable and replaceable from outside of the apparatus.

10 Claims, 4 Drawing Sheets

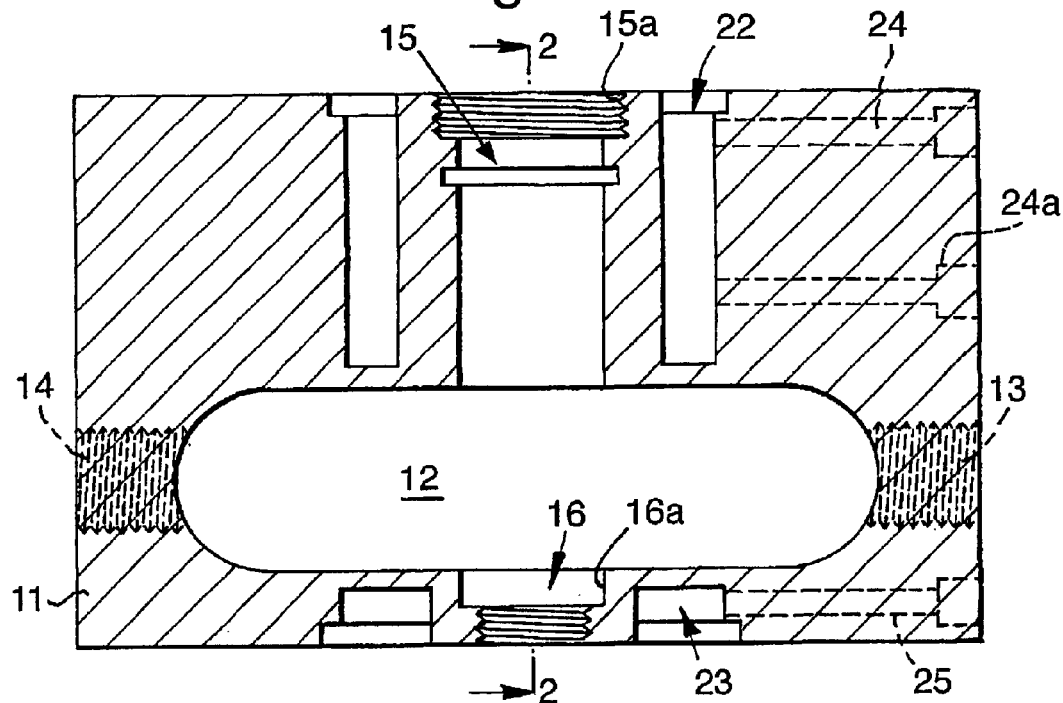
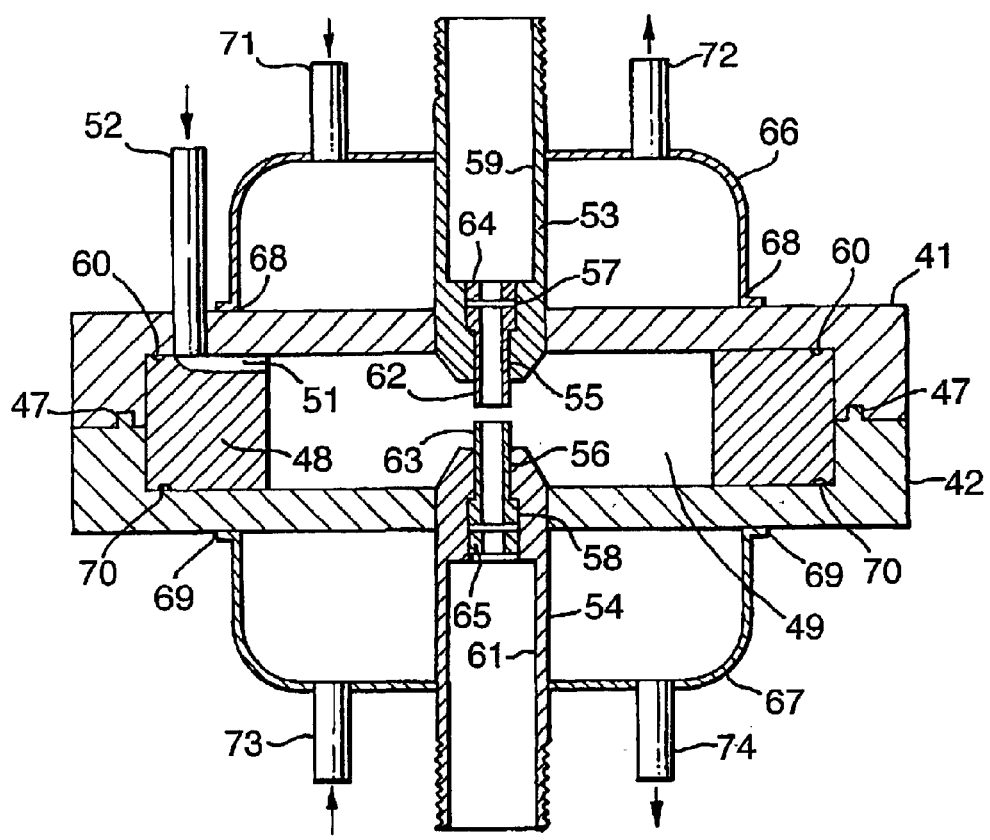

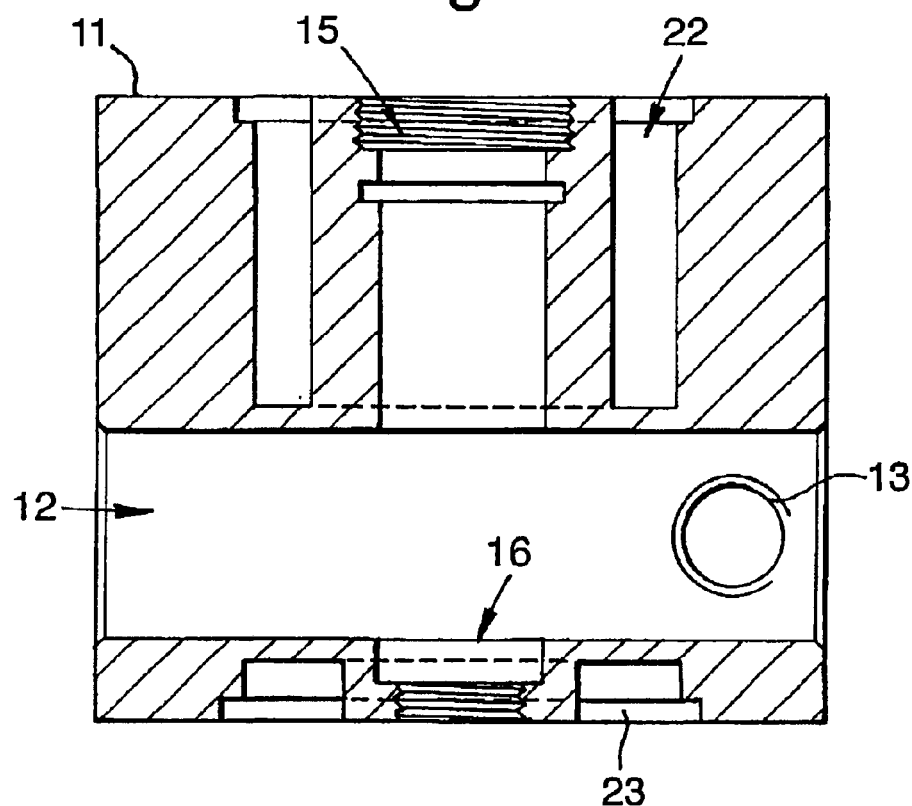
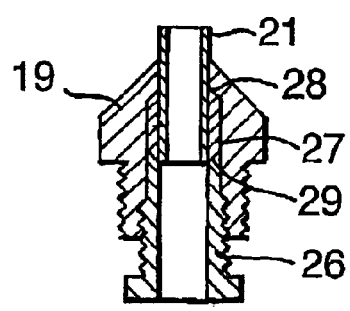
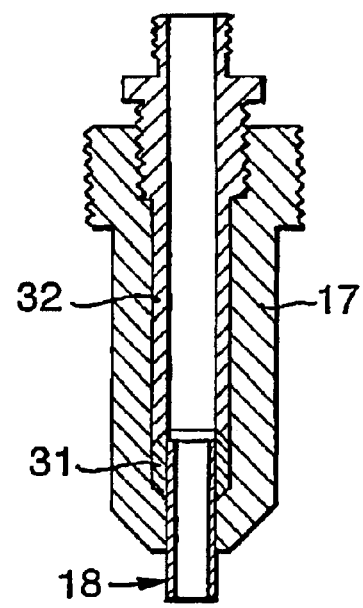

PLASMA ENHANCED GAS REACTOR

The invention relates to an apparatus in which a plasma is generated in a reaction chamber for enhancing reaction in a gaseous medium supplied to the reaction chamber.

A number of different forms of apparatus have been devised for making use of plasmas for processing materials or facilitating reactions between gaseous media. The present invention is an improvement upon the form of apparatus described in patent GB 2273027 which discloses a microwave plasma generator comprising a chamber, means for establishing a microwave field in the chamber, a pair of conical field-enhancing electrodes in the chamber, means for admitting a gaseous medium to be excited to the plasma state, and an axial hole in one of the electrodes through which the excited gaseous medium can be withdrawn from the chamber. Patent specification GB 2319941 describes an improvement which provides for a flow of a first reactant gas and a second reactant gas to intersect in the vicinity of the plasma, and means for extracting reaction products from the reaction chamber.

According to the present invention there is provided a plasma enhanced gas reactor apparatus comprising a reaction chamber, means for coupling microwave radiation into the chamber, a pair of opposed field enhancing electrodes for concentrating microwave energy so as to form plasma in a localised region between the electrodes, gas passages for passing a gaseous medium into and out of the chamber so that the gaseous medium passes through the said localised region of plasma, the electrodes comprising electrically conducting tubes, preferably made of tungsten, held in electrode holders located in the chamber wall, the electrode tubes being removable and replaceable from outside of the apparatus.

In one arrangement according to the invention, at least one of the electrode tubes is clamped in position by means of a collet positioned around the electrode tube and squeezed between a shoulder provided in the electrode holder and a sleeve screwed into the electrode holder to apply longitudinal pressure to the collet, the consequential radial expansion of the collet serving to clamp the electrode in position.

In an alternative arrangement according to the invention, at least one of the electrode tubes has a threaded portion of larger diameter than the remainder of the tube, the threaded portion on the tube co-operating with a threaded portion of the electrode holder and secured at its chosen location by a locknut.

Preferably, the reaction chamber is formed by the space between two plate members having side wall portions to form a shape in cross-section in the form of an elongated letter "n", the two plate members being secured together with the side wall portions of one plate member in abutment with the side wall portions of the other plate member.

The said space between the two plate members is closed at one end by a closure plate and at the other end is adapted for connection to a waveguide for supplying microwave radiation into the reaction chamber.

Preferably, one or both of the electrode holders has or have a hollow interior which communicates with the hollow interior of the associated electrode tube to provide a passageway for gaseous medium into and/or out of the reaction chamber, and a further passageway for gaseous medium into and/or out of the reaction chamber is provided through a wall of the chamber.

Specific examples of apparatus embodying the invention will now be described with reference to the drawings filed herewith, in which:

FIG. 1 is a cross-section of part of a first apparatus,

FIG. 2 is a cross-section on the line 2—2 in FIG. 1,

Figure 5:
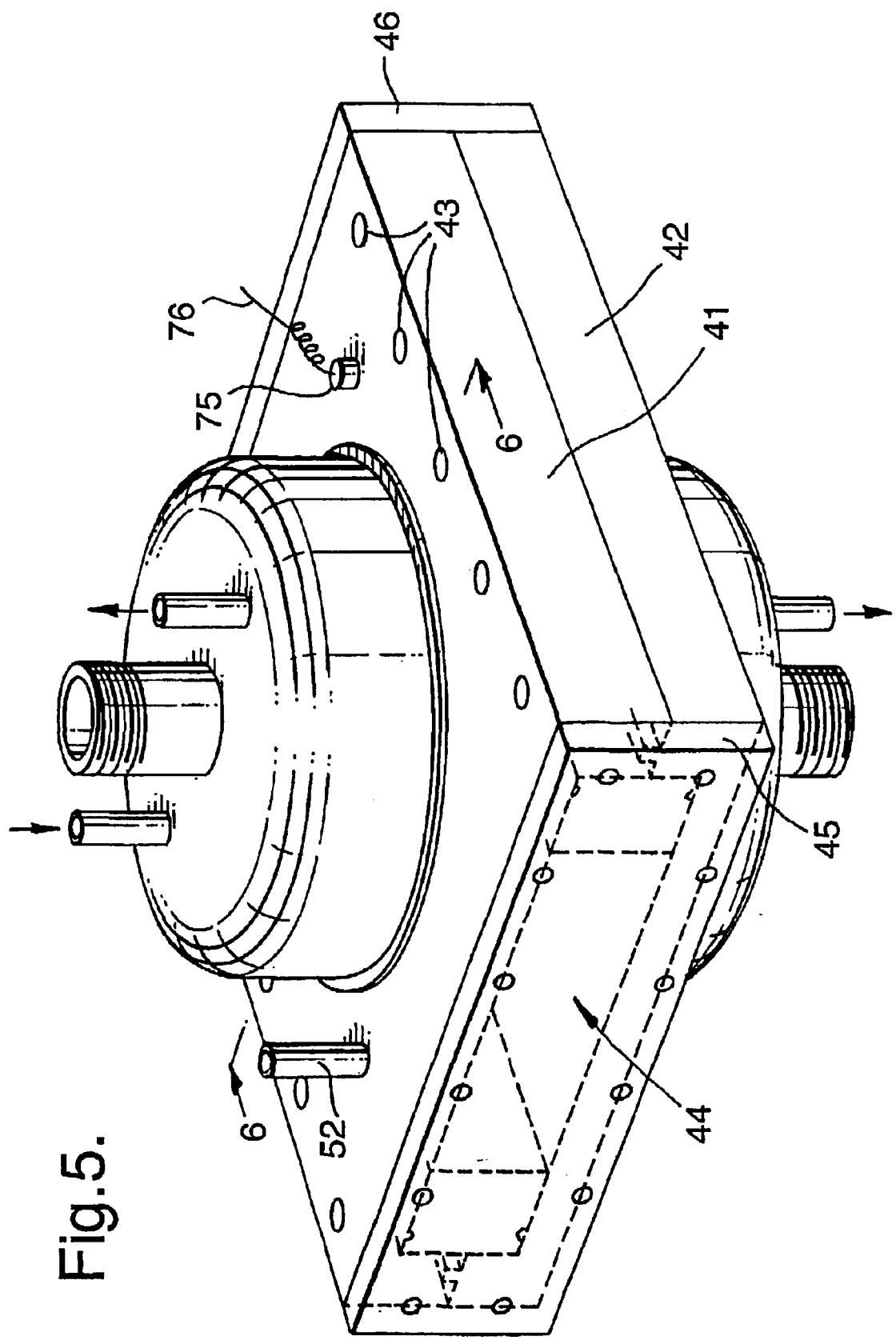
Figure 7:
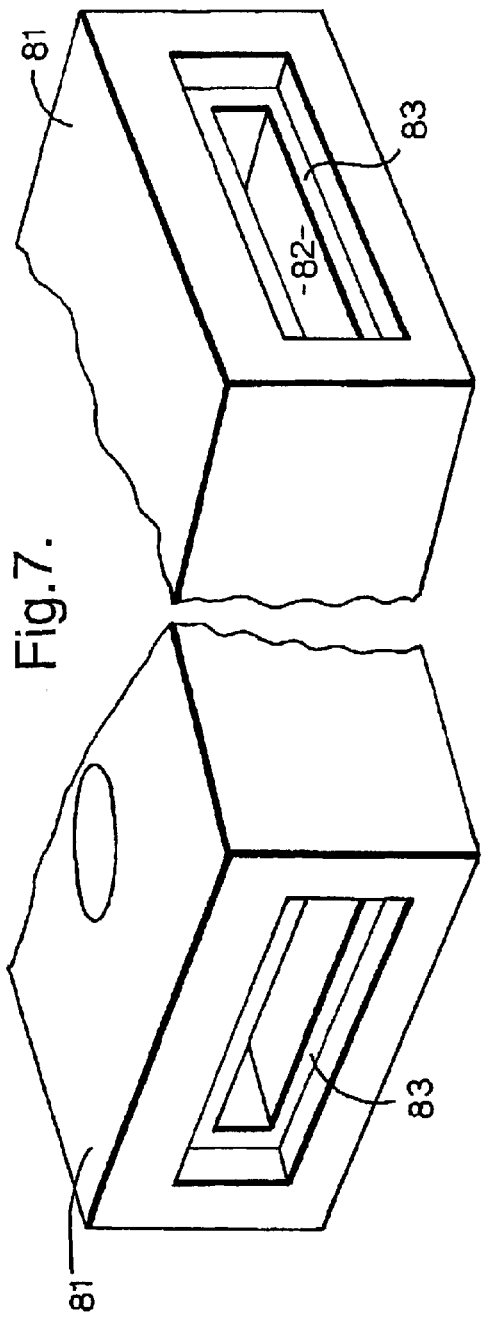
Figure 8:
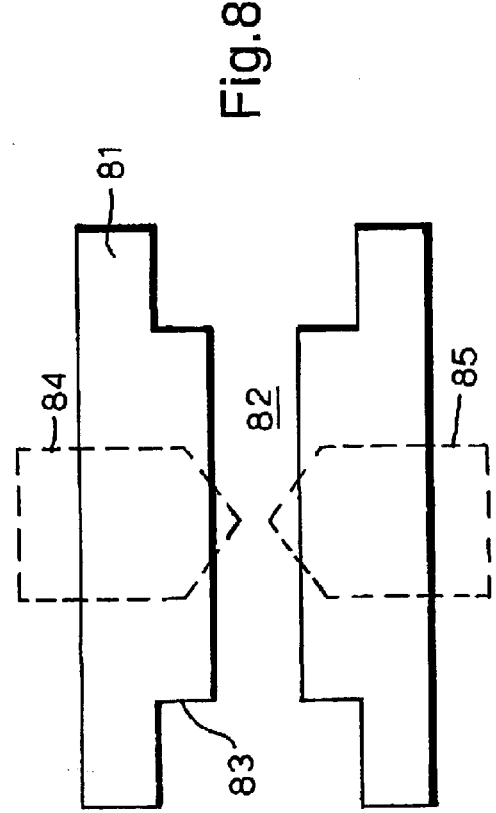

FIG. 3 and FIG. 4 are cross sections of electrodes and electrode holders forming part of the apparatus of FIG. 1 and FIG. 2, but not shown in those Figures, FIG. 5 is a perspective view of a second apparatus, FIG. 6 is a cross-section on the line 6—6 of FIG. 5, FIG. 7 is a diagrammatic, split perspective view of part of a modified form of apparatus, and FIG. 8 is a diagrammatic longitudinal section of the part shown in FIG. 7.

Referring to FIGS. 1 and 2, the main body of the apparatus is formed, by casting, fabrication, or machining from solid out of a block 11 of stainless steel. The reaction chamber 12 is a slot, which extends through the width of the block 11. One end of this slot is closed by a cover plate (not shown) and, in use, the other end is attached via an adapter plate (not shown) to a waveguide from a source of microwave energy which is coupled into the reactor chamber 12 via the waveguide. An illustration of a cover plate and adapter plate can be seen in FIG. 5 illustrating the second apparatus embodiment.

Gas flow ports 13 and 14 are provided one on each side of the reaction chamber 12 into which supply pipelines for reactant gaseous medium can be coupled. These gas flow ports 13, 14 are shown dotted in FIG. 1. As seen in FIG. 2 the gas flow port 13 is close to one end of the slot forming the reaction chamber 12. The gas flow port 14 on the other side is close to the opposite end of the slot forming the reaction chamber 12.

In the centre of the block 11 and extending transversely of the slot forming the reaction chamber 12 are cylindrical bores 15 and 16 each of which has a portion of increased diameter 15a and 16a respectively. In each bore the outermost portion is threaded, this being the portion 15a in bore 15 and the portion of smaller diameter in the bore 16. The bore 15 receives an electrode holder 17 and electrode 18 shown in FIG. 4. The bore 16 receives an electrode holder 19 and electrode 21 shown in FIG. 3. These electrode holders 17, 19 and electrodes 18, 21 are described more fully below.

Surrounding the bore 15 is an annular chamber 22. A corresponding annular chamber 23 surrounds the bore 16. These annular chambers 22 and 23 are provided to receive a flow of cooling water supplied respectively via cylindrical supply channels 24, 24a, 25. Cooling water flows in through channel 24, out through channel 24a which is connected by an external pipeline to channel 25 leading in to the chamber 23. The cooling water flow exits from chamber 23 via a further channel, not shown as it is behind channel 25 as seen in FIG. 1. The outermost portions of the annular chambers 22, 23 are of increased diameter and threaded so that a blank (not shown) can be screwed in to each of them to enclose the water chambers 22, 23.

Referring to FIG. 3, a cylindrical electrode holder 19 is shaped to be screw threadedly received in the bore 16 with a head portion of the electrode holder 19 engaging with the increased diameter portion 16a and providing a conical projection into the reaction chamber 12. The hollow interior of the electrode holder 19 has a diameter adjacent to the conical portion in which electrode tube 21, made of tungsten or a tungsten alloy, is a sliding fit. A short distance inside the holder 19, the diameter of the hollow interior increases gradually to form a tapered shoulder 28. Close to the opposite end of the holder 19, there is a further step increase in diameter and threading provided to receive a screw threaded portion of a tube 26. A collet 27 encircles the electrode tube 21 and engages against the tapered shoulder 28. The other end of the collet 27 is engaged by the innermost end of inner tube 26 which provides an oppositely directed taper at 29.

For assembly, the electrode tube 21 is positioned within the holder 19 so as to provide a desired spacing from electrode tube 18 and then locked in position by tightening the inner tube 26 onto the collet 27. The resultant longitudinal compression of the collet 27 provides a radial expansion which clamps the electrode tube 21 in place.

The electrode holder 17 shown in FIG. 4 is longer than electrode holder 19 and adapted to be received in the bore 15 with an increased diameter threaded portion engaging with the threaded portion 15a of the bore 15. Otherwise, the electrode holder 17 is generally similar to the electrode holder 19. Electrode tube 18 and collet 31 are identical with the electrode tube 21 and collet 27 and are clamped in position in the same way by means of inner tube 32.

The electrode tubes 18, 21 serve to concentrate microwave energy supplied to the reaction chamber 12. For this purpose the electrode tubes have to be of electrically conducting material. In this example the electrode holder components are also metallic and therefore electrically conducting, but they could be made from an electrically insulating material if desired.

In operation, a flow of cooling water is supplied to the annular chambers 22 and 23, reactant gaseous medium is supplied to the reaction chamber 12, and microwave energy is fed via a waveguide into the reaction chamber 12. An electric potential is established across the electrodes 18 and 21 so as to set up a localised region of plasma between the electrodes in a manner described in detail in patent specification GB 2319941.

It will be appreciated that the apparatus provides for gas flow through the ports 13, 14 and also through the hollow interiors of both electrodes 18 and 21. This means that a variety of different options for gas flow configurations are available. However, for effective utilisation of the concentrated energy in the localised plasma, it is necessary that flow of gaseous medium to be excited by the plasma is such as to ensure that gaseous medium passes through the localised plasma. For a single gaseous medium to be exposed to plasma, this may be effected by feeding the gaseous medium in through one or both of the gas flow ports 13, 14 and collecting outflowing gaseous medium from one or both of the hollow interiors of the electrode tubes 18,21 and their associated holders 17, 19. Alternatively, this flow arrangement may be reversed, with in-flow through the hollow interiors of the electrode tubes 18,21 and outflow through the ports 13,14. Two or even three different gaseous media can be supplied for interaction enhanced by the plasma. For example one gaseous medium can be introduced through gas flow port 13 and another via gas flow port 14, with outflow through one or both of the hollow interiors of the electrodes 18, 21 and their associated holders 17, 19. Or a main gas flow can be arranged to pass in through the hollow interior of one of the electrodes and out through that of the other electrode, whilst a reactant gas is introduced through one or both of the gas flow ports 13,14 and is energized, or converted or part converted into reactant species, by its passage through a curtain of plasma just prior to mixing with the main flow gas in the hollow interior of the electrodes. Or three different gaseous media may be introduced through respectively gas flow port 13, gas flow port 14 and the hollow interior of one of the electrodes, with outflow of the mixed, reacted gaseous medium through the hollow interior of the other electrode. Other flow configurations are possible, but it should be noted that, with the apparatus configuration of this example, an arrangement in which gaseous medium flows in through one of the gas flow ports, say 13, and out through the other gas flow port (14) is unlikely to be satisfactory since it is possible for some of the gas to pass directly from inlet to outlet without interacting with the localised plasma or excited reactant gas emerging therefrom.

FIGS. 5 and 6 illustrate a second apparatus which incorporates a number of modifications to facilitate manufacture.

The main body of this second apparatus is formed from a pair of nearly identical stainless steel components 41, 42 each in the form of a plate with depending side walls so as to have the shape of an elongated "n" in cross section, as may best be seen in FIG. 6. The components 41 and 42 are bolted together by bolts, not shown, but the locations of which are schematically illustrated for example at 43 in FIG. 5. Assembled in this way, the components 41 and 42 form an interior chamber 44 into which microwave energy may be coupled from a waveguide (not shown) via an adapter plate 45. The chamber 44 is closed at the end remote from adapter plate 45 by a cover plate 46. Along the abutting surfaces of the depending side walls of the components 41 and 42 there is provided, in one component 42, an upstanding ridge 47 (see FIG. 6) and, in the other component 41, a corresponding groove engaged by the ridge 47. This ensures there is no leakage path for microwaves out from the chamber 44.

Sandwiched within the chamber 44 is a block 48 of PTFE (polytetrafluoroethane). The block 48 exterior is rectangular in shape to fit snugly within the chamber 44. The block 48 has a circularly cylindrical aperture in the centre to form a reaction chamber 49. At one end, one side of the PTFE block 48 has a scalloped recess 51 which communicates with a gas flow pipeline 52 and is arranged to encourage in-flowing gas fed in through pipeline 52 to flow spirally into the reaction chamber 49. The objective of imparting spin to the gas flow is to achieve uniform pressure drop in the gas across the electrode tips to optimise the plasma.

Encircling the central aperture of the PTFE block 48 and outside the scalloped recess 51 is a groove in which is received an "O" ring 60, which, together with matching groove and "O" ring 70 on the other side of the PTFE block 48, serve to seal the reaction chamber 49.

Aligned with the central axis of the cylindrical reaction chamber 49 are circular apertures in the components 41 and 42. Welded into these apertures is a pair of electrode holders 53,54 of identical construction. The electrode holders 53,54 each provide a frusto-conical projection into the reaction chamber 49.

Each electrode holder is bored to three diameters, with the smallest diameter at 55,56 at the frusto-conical ends. The bores 55,56 each open into a wider, threaded, bore 57, 58, each of which in turn opens into a still wider, access, bore 59,61.

Each electrode 62,63 comprises a hollow tube of tungsten with a short externally threaded end-section of increased diameter. The electrodes 62,63 are received respectively in the electrode holders 53, 54, with the threaded portion engaging the co-operating thread provided in the bores 57,58 of the electrode holders. The electrodes 62 and 63 can thus be screwed to a desired position setting a required gap between the electrodes within the reaction chamber 49. The electrodes 62,63 are then locked in position by respective locknuts 64,65.

The electrodes 62, 63 and the adapter plate 45 are positioned so as to be separated by ¼ wavelength of the microwave energy coupled to the reactor in use, so as to concentrate the microwave energy at the electrodes 62, 63. The geometry of the adapter plate is very important for the tuning/optimisation of the microwave coupling to the electrodes 62, 63. Although the geometry of the adapter plate 45 may be fixed as shown, it may be advantageous to provide variable geometry in a similar fashion to an iris aperture to allow manual or automated tuning.

The ends of the electrode holders 59, 61 remote from the reaction chamber 49 are externally threaded (not shown in FIG. 6) to facilitate attachment of either a gas supply or a closure nut.

Surrounding the electrode holders 59 and 61, and sealingly engaged therewith, are cooling water jackets 66,67 which are respectively welded at 68,69 to the components 41, 42. Pipes 71, 72,73,74 provide for flow of water into and out of the water jackets 66,67.

An electrically insulating lead through 75 with central supply wire 76 enables a high potential trigger pulse to be applied when required to initiate plasma formation.

In use, the operation of the second apparatus as shown in FIGS. 5 and 6 is parallel with that described for the apparatus of FIGS. 1 to 4. Only three gas flow ports are shown in the apparatus of FIGS. 5 and 6, but it will be appreciated that a further gas flow port into the reaction chamber 49 may readily be provided diametrically opposite the one shown at 52, 51.

FIGS. 7 and 8 illustrate diagrammatically a modified form of block 81 containing a reaction chamber 82. The slot forming the reaction chamber 82 is formed with a step 83 so that the reaction chamber 82 is narrower in the region of the electrode tubes, the holders 84,85 for which are indicated only in dotted outline on FIG. 8. This modified configuration can be adopted in either of the examples of FIGS. 1–4 or FIGS. 5,6. The dimensions of the step 83 are calculated to optimise the coupling efficiency of the microwave energy to the tips of the electrodes.

Applications for the apparatus of these examples include exciting gases or materials carried in a gas flow for spectroscopic/diagnostic sources and detectors, reformation, catalytic processes such as for $NO_x$ reduction or removal of unwanted organic materials, medical sterilisation via excited oxidising species in gas, which can be applied to the sterilisation of artificial joints (eg. hip joints), metal volatilisation/plasma spraying, surface modification of materials, and vitrification of waste.

The invention is not restricted to the details of the foregoing examples. For instance, the electrodes need not necessarily be made of tungsten, but may, for example, be made from tungsten carbide and/or provided with diamond tips to improve erosion resistance. Alternatives to water jacket cooling are possible, such as airflow cooling and/or the use of cooling fins. The shaped PTFE block, which sealingly separates the reactor chamber 44 from the microwave waveguide, could be replaced with a simple window of PTFE, or other suitable microwave permeable material. In this case, however, the improved control of the gas flow would be forfeited.

The electrode tubes could be used as "sacrificial electrodes". Rather than replacing short electrode tubes from time to time, a longer electrode tube would be used and fed into the reaction chamber, most conveniently by a motor and feedback sensor mechanism which is adapted to maintain the relative position and separation of the electrode tubes. In this way, feed of electrode tube into the chamber would automatically compensate for erosion at the tube tips. Such a mechanism could provide the additional advantage of achieving auto strike of the plasma by first providing a small electrode separation to initiate the plasma and subsequently increasing the gap to stabilise the discharge intensity and minimise the electrode erosion rate.

What is claimed is:

1. A plasma enhanced gas reactor apparatus comprising a reaction chamber, means for coupling microwave radiation into the chamber, a pair of opposed field enhancing electrodes for concentrating microwave energy for forming plasma in a localized region between the electrodes, gas passages for passing a gaseous medium into and out of the chamber so that the gaseous medium passes through said localized region of plasma, electrode holders located in a wall of the chamber, the electrodes comprising electrically conducting tubes held in said electrode holders located in the chamber wall, the electrode tubes being removable and replaceable from outside of the apparatus.

2. Apparatus as claimed in claim 1, wherein the electrodes comprise tungsten tubes.

3. Apparatus as claimed in claim 2, wherein at least one of the electrode tubes is clamped in position by means of a collet positioned around the electrode tube and squeezed between a shoulder provided in the electrode holder and a sleeve screwed into the electrode holder to apply longitudinal pressure to the collet, the consequential radial expansion of the collet serving to clamp the electrode tube in position.

4. Apparatus as claimed in claim 2, wherein at least one of the electrode tubes has a threaded portion of larger diameter than the remainder of the tube, the threaded portion on the tube cooperating with a threaded portion of the electrode holder and secured at its chosen location by a locknut.

5. Apparatus as claimed in claim 1, wherein at least one of the electrode tubes is clamped in position by means of a collet positioned around the electrode tube and squeezed between a shoulder provided in the electrode holder and a sleeve screwed into the electrode holder to apply longitudinal pressure to the collet, the consequential radial expansion of the collet serving to clamp the electrode tube in position.

6. Apparatus as claimed in claim 1, wherein at least one of the electrode tubes has a threaded portion of larger diameter than the remainder of the tube, the threaded portion on the tube cooperating with a threaded portion of the electrode holder and secured at its chosen location by a locknut.

7. Apparatus as claimed in claim 1, wherein the reaction chamber is formed by the space between two plate members having side wall portions to form a shape in cross-section in the form of an elongated letter "n" and secured together with the side wall portions of one plate member in abutment with the side wall portions of the other plate member.

8. Apparatus as claimed in claim 7, wherein the said space between the two plate members is closed at one end by a closure plate and at the other end is adapted for connection to a waveguide for supplying microwave radiation into the reaction chamber.

9. Apparatus as claimed in claim 1, wherein one or both of the electrode holders has or have a hollow interior which communicates with the hollow interior of the associated electrode tube, to provide a passageway for gaseous medium into and/or out of the reaction chamber, and a further passageway for gaseous medium into and/or out of the reaction chamber is provided through a wall of the chamber.

10. A plasma enhanced gas reactor apparatus comprising a reaction chamber, means for coupling microwave radiation into said chamber, a pair of opposed field enhancing electrodes for concentrating microwave energy for forming plasma in a localized region between the electrodes, gas passages for passing a gaseous medium into and out of said chamber for passing the gaseous medium through said localized region, electrode holders located in a wall of the chamber, said electrodes comprising electrically conducting tubes held in said electrode holders, and means for removing and replacing said electrode tubes from outside of said apparatus.

* * * * *